United States Patent [19]
Teng et al.

[11] Patent Number: 5,710,459
[45] Date of Patent: Jan. 20, 1998

[54] INTEGRATED CIRCUIT PACKAGE PROVIDED WITH MULTIPLE HEAT-CONDUCTING PATHS FOR ENHANCING HEAT DISSIPATION AND WRAPPING AROUND CAP FOR IMPROVING INTEGRITY AND RELIABILITY

[75] Inventors: Kun-Tang Teng; Shin-Tang Jian, both of Chutung; Shu-Chen Huang, Young-Mei, all of Taiwan

[73] Assignee: Industrial Technology Research Institute, Taiwan

[21] Appl. No.: 689,534

[22] Filed: Aug. 9, 1996

Related U.S. Application Data

[63] Continuation of Ser. No. 437,408, May 19, 1995, abandoned.

[51] Int. Cl.[6] .................. H01L 23/34; H01L 23/12
[52] U.S. Cl. .................. 257/717; 257/704; 257/738; 257/774; 257/780; 361/713; 361/719
[58] Field of Search ............................ 257/697, 722, 257/796, 712, 713, 717, 738, 774, 780, 704; 361/713, 717, 718, 719, 720

[56] References Cited

U.S. PATENT DOCUMENTS

| | | | |
|---|---|---|---|
| 4,193,082 | 3/1980 | Dougherty | 257/697 |
| 4,396,936 | 8/1983 | McIver et al. | 357/81 |
| 4,514,752 | 4/1985 | Engel et al. | 257/697 |
| 4,724,472 | 2/1988 | Sugimato et al. | 257/697 |
| 4,908,696 | 3/1990 | Ishihara et al. | 257/722 |
| 5,027,191 | 6/1991 | Bourdelaise et al. | 357/74 |
| 5,113,315 | 5/1992 | Capp et al. | 361/386 |
| 5,311,059 | 5/1994 | Banerji et al. | 257/697 |
| 5,371,404 | 12/1994 | Juskey et al. | 257/796 |

FOREIGN PATENT DOCUMENTS

| | | | |
|---|---|---|---|
| 0082686 | 4/1993 | Japan | 257/774 |

Primary Examiner—Tom Thomas
Assistant Examiner—David Ostrowski
Attorney, Agent, or Firm—Finnegan, Henderson, Farabow, Garrett & Dunner, L.L.P.

[57] ABSTRACT

This invention is discloses a packaged integrated circuit (IC) which includes an IC chip supported and securely attached to an adapter board. The package also includes a chip cap for covering and protecting the IC chip therein. The chip cap further forms a concave, step near a lower edge of the cap for wrapping around the edge of the adapter board for increasing the contact areas between the cap and the board and for securely attaching the cap to the board. The chip cap is composed of thermal conductive materials and the chip cap further includes a heat sink for dissipating heat generated from the IC chip. The adapter board further includes a plurality of connecting vias and a plurality of conductive metal balls forming a ball grid array (BGA) underneath the adapter board. The IC chip is in electrical and thermal contact with the BGA by filling the connection vias with conductive materials. A printed circuit board (PCB) is used for supporting and receiving the adapter board thereon, the PCB includes a plurality of thermal vias penetrating therethrough and filled with thermal conductive materials, wherein the thermal vias corresponding to and in contact with a plurality of the conductive metal balls of the BGA for dissipating heat generated from the IC.

10 Claims, 1 Drawing Sheet

INTEGRATED CIRCUIT PACKAGE PROVIDED WITH MULTIPLE HEAT-CONDUCTING PATHS FOR ENHANCING HEAT DISSIPATION AND WRAPPING AROUND CAP FOR IMPROVING INTEGRITY AND RELIABILITY

This is a continuation of application Ser. No. 08/437,408, filed May 12, 1995, now abandoned.

BACKGROUND OF THE INVENTION

1. Field of the Invention

This invention relates generally to manufacture and packaging of integrated circuits (ICs). More particularly, this invention relates to an improved packaging configuration and method for high power integrated circuits (ICs) to improve the structure integrity and strength, and to enhance the dissipation of heat generated by the high power ICs.

2. Description of the Prior Art

The efficiency of dissipating the heat generated from the operation of integrated circuits is a major design concern for modern electronic industry. There are several reasons for this continuous demand of higher rates of heat dissipation. First, the density of circuits on IC devices as now manufactured by the use of modern electronic technology has increased almost exponentially over the past decade. The reliability and performance of these high density circuits are affected by the thermal environment if heat generated by operation is not properly dissipated. Secondly, due to the need of miniaturization, more and more electronic packages are being installed into very small spaces. Which also greatly increases the demand on the efficiency of dissipating the heat from these IC packages when they are being tightly packed into small boxes. Furthermore, IC devices are increasingly being used for high power applications. A conventional IC chip generally operates below few watts. However, some ICs are being designed to operate around 10 watts thus greatly increasing the need for packaging techniques capable of providing more efficient heat dissipation.

Bourdelaise et al. disclose in U.S. Pat. No. 5,027,191 a chip carrier assembly utilizing a cavity down chip carrier with a pad grid array. The IC chip within the chip carrier is mounted against a surface opposite the printed wiring board (PWB) to which the chip is attached such that the heat transfer from the IC chip may occur along a short path to a heat sink to enable a larger heat transfer rate. The improvement of heat transfer rate is still quite limited due to a small gap is usually required on the top surface of an IC chip to allow bonding wires to extend from the chip to connection pads surrounding the chip. This small gap between the IC chip and the flat thermal pad serving as a heat sink substantially reduce the heat transfer rate even that a shorter heat transfer path is provided in this carrier assembly. Due to the limited heat transfer rate, the heat dissipation rate of the chip carrier assembly by Bourdelaise et al. is still not sufficient for practical application to modern high power chips.

With the above limitations and difficulties, there is still a need in the art of IC packaging techniques to resolve these difficulties and limitations. Specifically, this new packaging technique must be able to provide improved heat dissipation rate for high power ICs and meanwhile increase the packaging integrity for providing better IC protection and higher reliability.

SUMMARY OF THE PRESENT INVENTION

It is therefore an object of the present invention to provide a new IC packaging configuration for protecting an IC chip by providing improved means for conducting heat in order to overcome the aforementioned difficulties for high power IC packaging encountered in the prior art.

Specifically, it is an object of the present invention to provide a new IC packaging configuration for protecting an IC chip by taking advantage of the ball grid array (BGA) to provide additional heat conductive vias through the supporting printed circuit board (PCB) such that higher heat dissipation rate can be accomplished.

Another object of the present invention is to provide a new IC packaging configuration for protecting an IC chip by employing a chip cover which is composed of heat conductive materials and provided with a heat sink to improve the rate of heat dissipation.

Another object of the present invention is to provide a new IC packaging configuration for protecting an IC chip by employing a chip cover which is formed with a concave step edge near the bottom for wrapping around the edge of an adapter board supporting the IC chip to improve the packaging strength and integrity.

Another object of the present invention is to provide a new packaging configuration for protecting an IC chip by providing multiple paths for conducting and transmitting the heat generated from the IC chip including a conductive path from the chip cap and another path of conducting the heat through the ball grid array to the bottom of printed circuit board through a plurality of thermal vias.

Briefly, in a preferred embodiment, the present invention comprises a packaged integrated circuit (IC) which includes an IC chip supported and securely attached to an adapter board. The package also includes a chip cap for covering and protecting the IC chip therein. The chip cap further forms a concave step near a lower edge of the cap for wrapping around the edge of the adapter board for increasing the contact areas between the cap and the board and for securely attaching the cap to the board. The chip cap is composed of thermal conductive materials and the chip cap further includes a heat sink for dissipating heat generated from the IC chip. The adapter board further includes a plurality of connecting vias and a plurality of conductive metal balls forming a ball grid array (BGA) underneath the adapter board. The IC chip is in electrical and thermal contact with the BGA by filling the connection vias with conductive materials. A printed circuit board (PCB) is used for supporting and receiving the adapter board thereon, the PCB includes a plurality of thermal vias penetrating therethrough and filled with thermal conductive materials, wherein the thermal vias corresponding to and in contact with a plurality of the conductive metal balls of the BGA for dissipating heat generated from the IC.

It is an advantage of the present invention that it provides a new IC packaging configuration for protecting an IC chip by taking advantage of the ball grid array (BGA) to provide additional heat conductive vias through the supporting printed circuit board (PCB) such that higher heat dissipation rate can be accomplished.

Another advantage of the present invention is that it provides a new IC packaging configuration for protecting an IC chip by employing a chip cover which is composed of heat conductive materials and provided with a heat sink to improve the rate of heat dissipation.

Another advantage of the present invention is that it provides a new IC packaging configuration for protecting an IC chip by employing a chip cover which is formed with a concave step edge near the bottom for wrapping around the edge of an adapter board supporting the IC chip to improve the packaging strength and integrity.

Another advantage of the present invention is that it provides a new packaging configuration for protecting an IC chip by providing multiple paths for conducting and transmitting the heat generated from the IC chip including a conductive path from the chip cap and anther path of conducting the heat through the ball grid array to the bottom of printed circuit board through a plurality of thermal vias.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
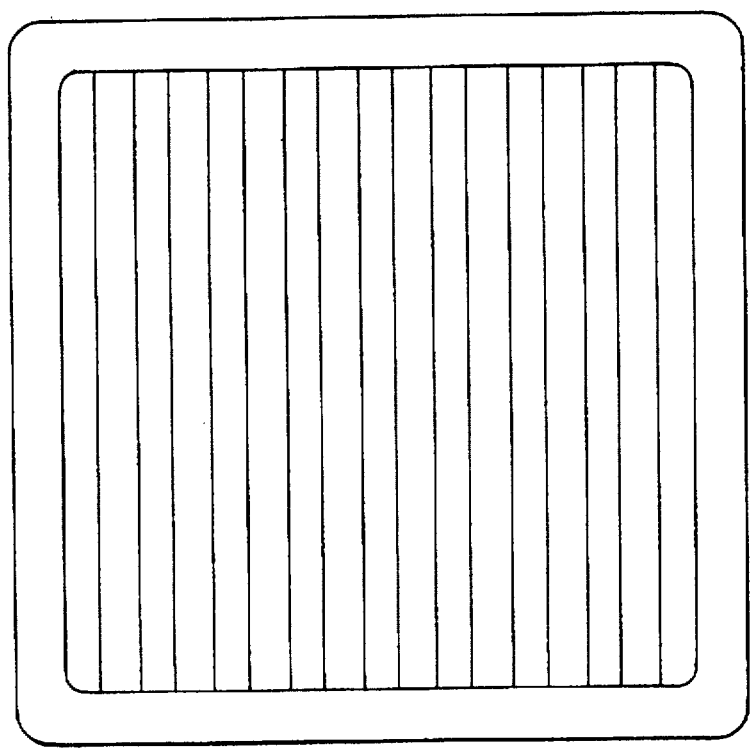
FIGS. 1A and 1B are plan and cross-sectional views of a packaged integrated circuit of the present invention.
Figure 1B:
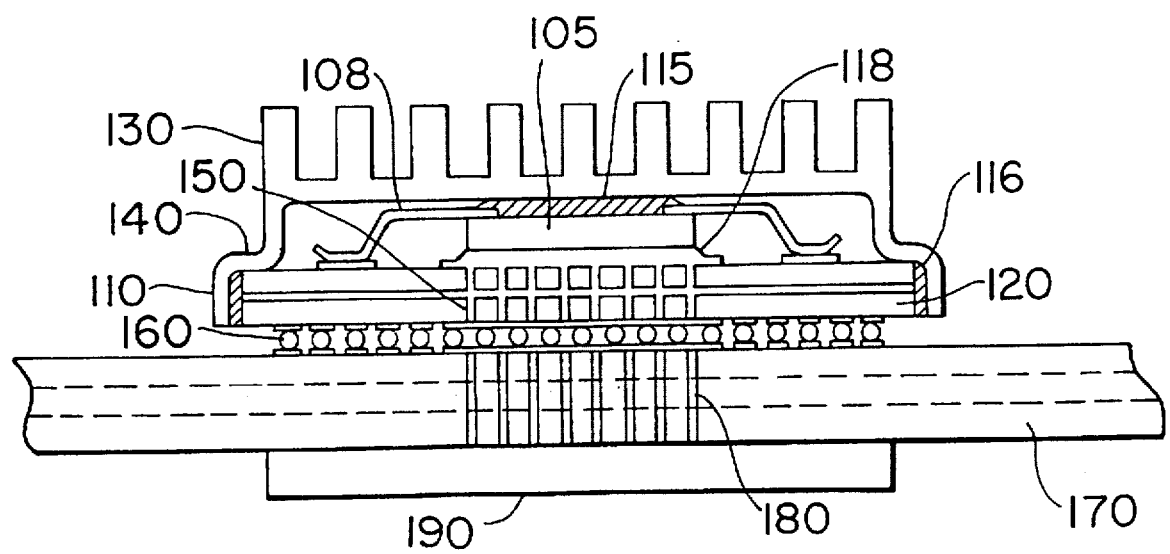

FIGS. 1A and 1B show a packaged IC 100 of the present invention. The packaged IC 100 includes an IC chip 105 with the bonding lead wires 108 enclosed and protected by a chip cap 110. The IC chip 105 is attached to the chip cap 110 via a top thermal adhesive layer 115 and to an adapter board 120 via a bottom thermal adhesive layer 118. The top adhesive layer 115 is preferably a layer composed of 3M Arcylic adhesive agent and the bottom adhesive layer 118 is preferably a layer composed of silver adhesive agent, e.g., Heraeus PC-5915, which can function both as adhesive agent and a conductive layer. The chip cap 110 is formed with a heat sink 130 on the top surface to enhance the heat dissipation. The chip cap 110 is further formed to include a concave step 140 on the side wherein the inside of the lower portion of the concave step 140 is attached to the adapter board 150 by applying an epoxy 116, e.g., the Ablestic 9331 epoxy, for securely attached thereon. This concave step 140 enables the chip cap to cover the edge of the IC chip 105 and more securely attached thereon to increase the integrity and reliability of this packaged IC 100. The heat sink 130 formed on the top surface of the chip cap 110 is provided to dissipate the heat transmitted from the IC chip 105 via the top adhesive layer 115.

The adapter board 120 attached to the bottom surface of the IC chip 105 is provided with a plurality of through-vias 150 underneath the bottom adhesive layer 118. The through-vias are filled with conductive material to be in electric contact with the bottom adhesive layer 118 to provide electric contact to a plurality of ball-grid array (BGA) 160 formed on the bottom surface of the adapter board 120. The BGA 160 includes a plurality of ball grids to make electric contact with other devices (not shown) disposed on a main board 170 which is usually a printed circuit board (PCB), e.g. a mother board for a personal computer. The main board 170 is further provided with a plurality of thermal vias 180 which are filled with materials of high thermal conductivity. The thermal vias 180 are in physical contact with the ball grids 160 to receive heat transmitted thereto. The high heat conductivity provided in the thermal vias 180 further transmits the heat from the BGA 160 to a hear spreader 190. The thermal vias can be filled with thermal conductive materials such as copper, nickel, silver, gold, titanium, or other type of materials with high thermal conductivity.

This packaged IC 100 is particularly suitable for implementation to a high power IC chip 105 which may have a operational power ranging from few watts up to 10 watts. Specifically, this packaged IC takes advantage of the ball grid design where the vias 150 connecting IC chip 105 to the BGA 160 forms a conductive path for dissipating the heat from the IC chip 105 to the BGA 160. The thermal vias 180 which are filled with high conductive materials further provide a subsequent conductive path to dissipate the heat from the BGA 160 to the heat spreader board 190 on the bottom of the main board 170.

The present invention thus discloses a printed circuit board 170 (PCB) for receiving an integrated circuit (IC) chip 105 thereon wherein said IC chip 105 including a ball grid array 160 having a plurality of conductive metal balls which are electrically and thermally connected to an integrated circuit chip 105. The printed circuit board (PCB) include a main board 170 which includes a plurality of thermal vias 180 penetrating the main board 170 and filled with thermal conductive materials. The thermal vias 170 corresponding to a plurality of the conductive metal balls 160 are employed for dissipating heat generated from the IC chip 105. In a preferred embodiment the printed circuit board (PCB) 170 further includes a heat spreading means 190 attached to the main board 170 which being in thermal contact with the thermal vias 180 for spreading and enhancing heat dissipation.

The present invention further discloses a packaged integrated circuit (IC) 100 which includes an IC chip 105 and an adapter board 120 for supporting and securely attached the IC chip 105 thereon. The packaged IC 100 further includes a chip cap 110 for covering and protecting the IC chip therein. The chip cap further forms a concave step 140 near a lower edge of the cap 110 for wrapping around the edge of the adapter board 120 for increasing the contact areas between the cap 110 and the board 120 and securely attaching the cap to the board.

In summary, the present invention thus discloses a packaged integrated circuit (IC) 100 which includes an IC chip 105 and an adapter board 120 for supporting and securely attached the IC chip 105 thereon. The packaged IC 100 further includes a chip cap 110 for covering and protecting the IC chip 105 therein. The chip cap 110 further forms a concave step 140 near a lower edge of the cap 110 for wrapping around the edge of the adapter board 120 for increasing the contact areas between the cap 110 and the board 120 and securely attaching the cap 110 to the board 120. The chip cap 110 is composed of thermal conductive materials and the chip cap 110 further includes a heat sink means 130 for dissipating heat generated from the IC chip 105. The adapter board 120 further includes a plurality of connecting vias 150 and a plurality of conductive metal balls 160 forming a ball grid array (BGA) 160 underneath the adapter board. The IC chip 105 being in electrical and thermal contact with the BGA 160 by filling the connection vias 150 with conductive materials. The packaged IC 100 further includes a printed circuit board (PCB) 170 for supporting and receiving the adapter board 120 thereon. The PCB 170 includes a plurality of thermal vias 180 penetrating therethrough and filled with thermal conductive materials, wherein the thermal vias 180 corresponding to and in contact with a plurality of the conductive metal balls of the BGA 160 for dissipating heat generated from the IC.

In summary, the present invention discloses a new and non-obvious IC packaging configuration for protecting an IC chip by employing an improved means for conducting heat in order to overcome the heat dissipation difficulties for high power IC packages as encountered in the prior art. Specifically, the present invention takes advantage of the ball grid array (BGA) to provide additional heat conductive vias through the supporting printed circuit board (PCB) such that higher heat dissipation rate can be accomplished. Also, the chip cover of the packaged IC is composed of heat conductive materials and provided with a heat sink to improve the rate of heat dissipation. Furthermore, the new near cover is formed with a concave step edge near the bottom for wrapping around the edge of an adapter board supporting the IC chip to improve the packaging strength and integrity. Therefore, the present invention provides a new packaging configuration for protecting an IC chip which provides multiple paths for conducting and transmitting the heat generated from the IC chip. The new IC package includes a conductive path from the chip cap and another path of conducting the heat through the ball grid array to the bottom of printed circuit board through a plurality of thermal vias.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the hue spirit and scope of the invention.

We claim:

1. A printed circuit board (PCB) for receiving an integrated circuit (IC) chip thereon wherein said IC chip including a ball grid array having a plurality of conductive metal balls electrically and thermally connected to said integrated circuit chip, the printed circuit board (PCB) comprising:

a main board including a plurality of thermal vias penetrating said main board and filled with thermal conductive materials, wherein said thermal vias are in thermal contact with a plurality of said conductive metal balls for dissipating heat generated from said IC chip and wherein said thermal vias filled with said thermal conductive material are electrically insulated from said metal balls and provided only for dissipating heat without providing an active electrical function.

2. The printed circuit board (PCB) of claim 1 further comprising:

a heat spreading means attached to said main board which being in thermal contact with said thermal vias for spreading and enhancing heat dissipation.

3. A packaged integrated circuit (IC) comprising:

an IC chip;

an adapter board for supporting and securely attached said IC chip thereon, said adaptor board further includes a plurality of connecting vias penetrating therethrough for electrically and thermally connecting to said IC chip wherein each of said plurality of connecting vias connected to an electric output connection means disposed on a bottom surface of said adapter board;

a chip cap for covering and protecting said IC chip therein said chip cap further forming a concave step near a lower edge of said cap for wrapping around the edge of said adapter board for increasing the contact areas between said cap and said board and securely attaching said cap to said board and said chip cap being composed of thermal conductive materials and said chip cap further including a heat sink means for dissipating heat generated from said IC chip; a main board including a plurality of thermal vias penetrating said main board and filled with thermal conductive materials, wherein said thermal vias are in thermal contact with said electric output connecting means for dissipating heat generated from said IC chip and wherein said thermal vias filled with said thermal conductive material are electrically insulated from said electric output connection means and provided only for dissipating heat without providing an active electrical function; and a heat spreading means disposed below and integrated securely with said main board for spreading and dissipating heat transmitted from said IC chip wherein said heat spreading means and said chip cap being formed as one-integrated heat dissipation body whereby heat generated by said IC chip is provided to simultaneously dissipate from top and bottom.

4. The packaged IC of claim 3 wherein:

each of said electric output connection means being a conductive ball thus constituting a ball grid array (BGA)underneath said adapter board; and said thermal vias penetrating said main board are in thermal contact with a plurality of said conductive metal balls for dissipating heat generated from said IC chip and wherein said thermal vias filled with said thermal conductive material are electrically insulated from said metal balls and provided only for dissipating heat without providing an active electrical function.

5. The packaged IC of claim 4 further comprising:

said main board is a printed circuit board (PCB) for supporting and receiving said adapter board thereon; and said PCB including a plurality of thermal vias penetrating therethrough and filled with thermal conductive materials, wherein said thermal vias corresponding to and in contact with a plurality of said conductive metal balls of said BGA for dissipating heat generated from said IC and wherein said thermal vias filled with said thermal conductive material are electrically insulated from said metal balls being provided only for dissipating heat without providing an active electrical function.

6. The packaged IC of claim 5 wherein:

said IC chip further being attached to said chip cap and said adapter board by using thermal conductive adhesive materials.

7. A packaged integrated circuit (IC) comprising:

an IC chip;

an adapter board for supporting and securely attached said IC chip thereon;

a chip cap for covering and protecting said IC chip therein said chip cap further forming a concave step near a lower edge of said cap for wrapping around the edge of said adapter board for increasing the contact areas between said cap and said board and securely attaching said cap to said board;

said chip cap being composed of thermal conductive materials and said chip cap further including a heat sink means for dissipating heat generated from said IC chip;

said adapter board further including a plurality of connecting vias and a plurality of conductive metal balls forming a ball grid array (BGA) underneath said adapter board;

said IC chip being in electrical and thermal contact with said BGA by filling said connection vias with conductive materials; and A printed circuit board (PCB) for supporting and receiving said adapter board thereon, said PCB including a plurality of thermal vias penetrating therethrough and filled with thermal conductive materials, wherein said thermal vias corresponding to and in contact with a plurality of said conductive metal balls of said BGA for dissipating heat generated from said IC and wherein said thermal vias filled with said thermal conductive material are electrically insulated from said metal balls and provided only for dissipating heat without providing an active electrical function.

8. The packaged IC of claim 7 wherein: said IC chip further being attached to said chip cap and said adapter board by using thermal conductive adhesive materials.

9. The packaged IC of claim 8 wherein: said PCB further includes a heat spreading means for spreading and dissipating heat transmitted from said IC chip.

10. The packaged IC of claim 8 wherein: said PCB further includes a heat sink means for dissipating heat transmitted from said IC chip.

* * * * *

UNITED STATES PATENT AND TRADEMARK OFFICE
CERTIFICATE OF CORRECTION

PATENT NO.: 5,710,459

DATED: January 20, 1998

INVENTOR(S): Kun-Tang Teng et al.

It is certified that an error appears in the above-identified patent and that said Letters Patent is hereby corrected as shown below:

In the Abstract:
 Line 5; after "concave" the comma "," should be deleted.

In the claims:
 Claim 7, col. 6, line 47: the word "attached" should be --attaching--.

Signed and Sealed this

Fifteenth Day of December, 1998

Attest:

BRUCE LEHMAN

Attesting Officer  Commissioner of Patents and Trademarks